(12) United States Patent
Beaupre et al.

(10) Patent No.: US 8,358,000 B2
(45) Date of Patent: Jan. 22, 2013

(54) DOUBLE SIDE COOLED POWER MODULE WITH POWER OVERLAY

(75) Inventors: Richard Alfred Beaupre, Pittsfield, MA (US); Arun Virupaksha Gowda, Rexford, NY (US); Ljubisa Dragoljub Stevanovic, Clifton Park, NY (US); Stephen Adam Solovitz, Portland, OR (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/404,272

(22) Filed: Mar. 13, 2009

(65) Prior Publication Data

US 2010/0230800 A1 Sep. 16, 2010

(51) Int. Cl.
*H01L 23/48* (2006.01)
(52) U.S. Cl. ................. 257/691; 257/E23.141
(58) Field of Classification Search ............... 257/691, 257/E23.141
See application file for complete search history.

(56) References Cited

U.S. PATENT DOCUMENTS

| | | | |
|---|---|---|---|
| 6,232,151 B1 | 5/2001 | Ozmat et al. | |
| 6,306,680 B1 * | 10/2001 | Fillion et al. | 438/106 |
| 6,930,385 B2 | 8/2005 | Hsu et al. | |
| 7,327,024 B2 | 2/2008 | Stevanovic et al. | |
| 2007/0215325 A1 * | 9/2007 | Solovitz et al. | 165/80.4 |
| 2008/0190748 A1 | 8/2008 | Arthur et al. | |
| 2009/0149021 A1 * | 6/2009 | Hillman et al. | 438/654 |

OTHER PUBLICATIONS

Bryan Charles Charboneau, Double-Sided Liquid Cooling for Power Semiconductor Devices Using Embedded Power Technology, Thesis submitted to the faculty of the Virginia Polytechnic Institute and State University in partial fulfillment of the requirement for the degree of Master of Science in Electrical Engineering, Jul. 22, 2005, Blacksburg, Virginia, pp. 1-97.

Ray Fillion, Rich Beaupre, Power Packaging Technology Offers High Thermal Performance, GE Global Research Center, Niskayuna, N.Y., Semiconductor International, pp. 1-11, Dec. 1, 2002.

Charlotte Gillot, Christian Schaeffer, Claude Massit, Luc Meysenc, Double-Sided Cooling for High Power IGBT Modules Using Flip Chip Technology, IEEE Transactions on Components and Packaging Technologies, vol. 24, No. 4, pp. 698-704, Dec. 2001.

Shatil Haque, Kun Xing, Ray-Lee Lin, Carlos T.A. Suchicital, Guo-Quan Lu, Douglas J. Nelson, Dusan Borojevi'c, Fred C. Lee, An Innovative Technique for Packaging Power Electronic Building Blocks Using Metal Posts Interconnected Parallel Plate Structures, IEEE Transactions on Advanced Packaging, vol. 22, No. 2, pp. 136-144, May 1999.

* cited by examiner

*Primary Examiner* — Eugene Lee
*Assistant Examiner* — Elias M Ullah
(74) *Attorney, Agent, or Firm* — Ziolkowski Patent Solutions Group, SC; Jean K. Testa

(57) ABSTRACT

A power module includes one or more semiconductor power devices having a power overlay (POL) bonded thereto. A first heat sink is bonded to the semiconductor power devices on a side opposite the POL. A second heat sink is bonded to the POL opposite the side of the POL bonded to the semiconductor power devices. The semiconductor power devices, POL, first channel heat sink, and second channel heat sink together form a double side cooled power overlay module. The second channel heat sink is bonded to the POL solely via a compliant thermal interface material without the need for planarizing, brazing or metallurgical bonding.

23 Claims, 2 Drawing Sheets

DOUBLE SIDE COOLED POWER MODULE WITH POWER OVERLAY

STATEMENT REGARDING FEDERALLY SPONSORED RESEARCH & DEVELOPMENT

This invention was made with U.S. Government support under contract number W91 INF-04-2-0045. The Government has certain rights in the invention.

BACKGROUND

The invention relates generally to an apparatus for cooling a heated surface and, more particularly, to a double side cooled power module using power overlay technology to interconnect semiconductor power devices in a planar manner.

The development of higher-density power electronics has made it increasingly more difficult to cool power semiconductor devices. With modern silicon-based power devices capable of dissipating up to 500 W/cm$^2$, there is a need for improved thermal management solutions. When device temperatures are limited to 50 K increases, natural and forced air cooling schemes can only handle heat fluxes up to about one (1) W/cm$^2$. Conventional liquid cooling plates can achieve heat fluxes on the order of a twenty (20) W/cm$^2$. Heat pipes, impingement sprays, and liquid boiling are capable of larger heat fluxes, but these techniques can lead to manufacturing difficulties and high cost.

An additional problem encountered in conventional cooling of high heat flux power devices is non-uniform temperature distribution across the heated surface. This is due to the non-uniform cooling channel structure, as well as the temperature rise of the cooling fluid as it flows through long channels parallel to the heated surface.

One promising technology for high performance thermal management is micro-channel cooling. In the 1980's, it was demonstrated as an effective means of cooling silicon integrated circuits, with designs demonstrating heat fluxes of up to 1000 W/cm$^2$ and surface temperature rise below 100° C. Known micro-channel designs require soldering a substrate (with micro-channels fabricated in the bottom copper layer) to a metal-composite heat sink that incorporates a manifold to distribute cooling fluid to the micro-channels. Further, these known micro-channel designs employ very complicated backside micro-channel structures and heat sinks that are extremely complicated to build and therefore very costly to manufacture.

Although power overlay technology (POL) has been employed to provide double-sided cooling, these known structures have not utilized micro-channel features to enhance thermal performance of POL modules. Further, known POL technology generally requires smoothing, brazing and/or soldering operations in order to satisfactorily bond heat sinks to the POL.

In view of the foregoing, it would be desirable to provide a double side cooled power module using power overlay technology that employs cooling channel features to enhance thermal performance of POL modules and that is relatively simple to assemble and that does not compromise cooling-channel features in subsequent processing operations following construction of substrate cooling-channels. It would also be advantageous if the double side cooled power module using POL technology could be implemented without use of smoothing, brazing, or soldering operations.

BRIEF DESCRIPTION

Briefly, in accordance with one embodiment, a power overlay module comprises:

at least one semiconductor power device;
a power overlay (POL) bonded to the at least one semiconductor power device;
a first heat sink bonded to the at least one semiconductor power device on a side of the at least one semiconductor power device opposite the POL; and
a second heat sink bonded to the POL solely via a compliant thermal interface material (TIM) opposite the side of the POL bonded to the at least one semiconductor, the at least one semiconductor power device, POL, first heat sink, and second heat sink together forming a double side cooled power overlay module.

According to another embodiment, a power overlay module comprises:

at least one semiconductor power device;
a power overlay bonded to the at least one semiconductor power device;
a first substrate assembly bonded to the at least one semiconductor power device, the first substrate assembly comprising:
  a ceramic layer comprising a first planar surface and a second planar surface substantially parallel to the first planar surface;
  a metal layer bonded to the first planar surface;
  a channel layer bonded to the second planar surface; and
  a manifold layer bonded to a surface of the channel layer opposite the second planar surface, the first substrate assembly layers configured together as a single unitary substrate; and
a second substrate assembly bonded to the power overlay solely via a compliant thermal interface material (TIM), the second substrate assembly comprising:
  a ceramic layer comprising a third planar surface and a fourth planar surface substantially parallel to the third planar surface;
  a metal layer bonded to the third planar surface;
  a channel layer bonded to the fourth planar surface; and
  a manifold layer bonded to a surface of the channel layer opposite the fourth planar surface, the second substrate assembly layers configured together as a single unitary substrate.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
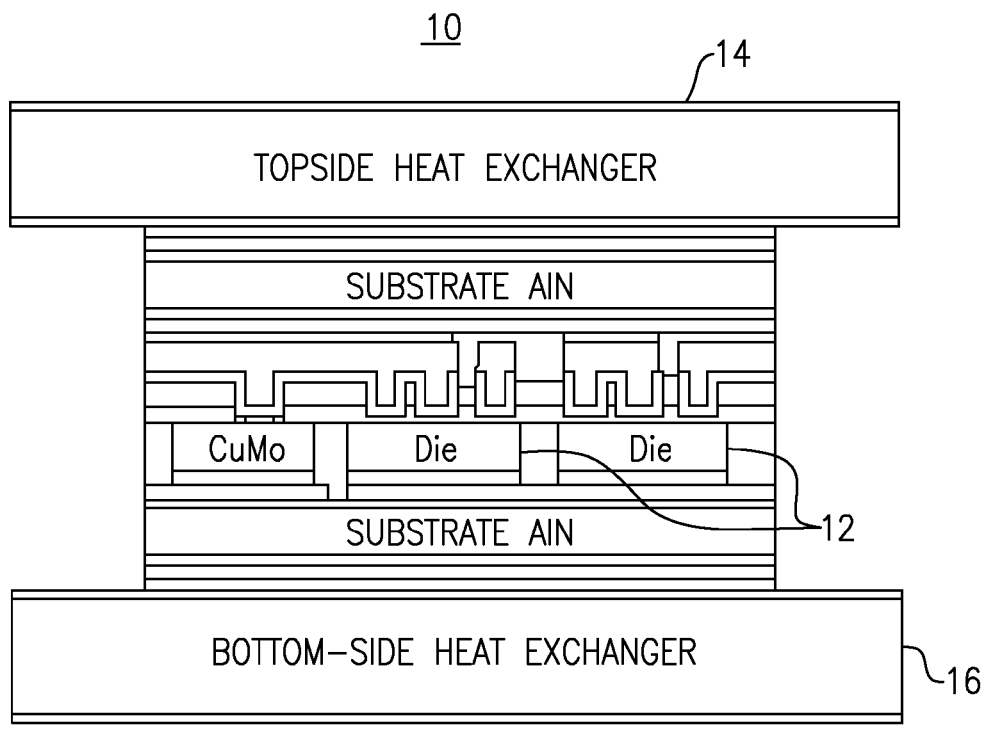
FIG. 1 is a side profile view illustrating a double side heat exchanger cooled power module with power overlay that is known in the art.

FIG. 1 is a side profile view illustrating a double side heat exchanger cooled power module 10 using power overlay technology that is known in the art. Double side cooling of semiconductor power modules using power overlay technology is known in the art. Because of the unique planar structure of the power overlay technology, modules using power overlay technology can be cooled from both the top and bottom sides of the power module since the elimination of wire bonds or even solder bumps from the top surface of the power devices subsequent to a smoothing operation leaves the top surface virtually planar. The structure illustrated in FIG. 1 can have a significantly lower junction temperature because the thermal cooling structure is connected to the area of the chip where the heat is generated.

The double side heat exchanger cooled power module 10 with power overlay technology includes power chips 12 configured as a power module using power overlay technology and attached via metallurgically bonding to a topside conventional heat exchanger 14 and a bottom-side conventional heat exchanger 16. Conventional heat exchanger technology including known methods of using micro-channel technology however employ metallurgical bonding techniques such as soldering or brazing, and therefore require an additional surface smoothing operation such as stated above.

Figure 2:
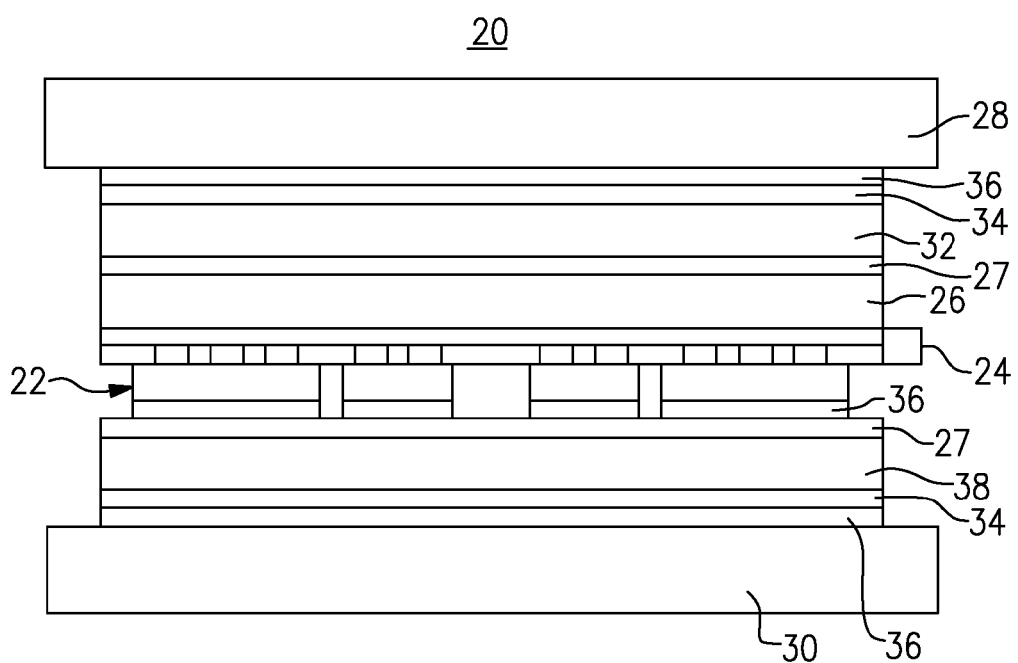
FIG. 2 is a side profile view illustrating a double side channel cooled power module with power overlay according to one embodiment.

FIG. 2 is a side view illustrating a double side channel cooled power module 20 using power overlay technology according to one embodiment. Power module 20 includes a plurality of semiconductor power chips 22 bonded to a power overlay (POL) 24 having an area that may comprise, for example, copper and Kapton. According to one embodiment, a layer of compliant thermal interface material(s) (TIM) 26 having a thermal conductivity greater than about 2 W/mK is bonded to the POL 24 opposite the side of the POL 24 bonded to the semiconductor power chips 22. Examples of suitable TIMs include, without limitation, adhesives, greases, gels, pads, films, liquid metals, compressible metals, and phase change materials. Liquid metal TIMs, for example, are typically indium-gallium alloys that are in liquid state over temperatures typically encountered in power electronics applications. Compressible metals are sufficiently soft to make intimate contact between a heatsink and POL mating surfaces and may include, for example, indium. In this manner, heat sinks such as described herein may be thermally bonded to the POL 24 without the use of brazing or metallurgical bonding the heat sink(s) directly to the POL 24 or without the need to planarize the POL 24 prior to bonding the POL 24 to the heat sink(s).

A first ceramic substrate 32 comprising, for example, aluminum-oxide ($Al_2O_3$), aluminum nitride (AlN), beryllium oxide (BeO) or silicon nitride ($Si_3N_4$) is bonded to the TIM 26 via a first copper metal layer 27. A top metal layer such as copper 34 is metallurgically bonded to the opposite side of the ceramic substrate 32. Other similar ceramic materials may also be employed so long as the ceramic material can be metallurgically bonded with the copper layers 27, 34. Metal layers 27, 34 may be, for example, direct bond copper (DBC) or active metal braze (AMB) layers that are bonded to the ceramic substrate 32.

According to one embodiment, a first channel heat sink assembly 28 is attached to the substrate 32 via a solder bond 36 between the copper layer 34 opposite the side of the substrate 32 bonded to the TIM 26 and the channel heat sink assembly 28. A second substrate 38 and a second channel heat sink assembly 30 are similarly bonded to the outer exposed planar surfaces of the semiconductor power chips 22 opposite the side of the semiconductor power chips 22 bonded to the POL 24. According to one aspect, channel heat sink assembly 28 may be identical to channel heat sink assembly 30 and so only channel assembly 28 is described in detail herein to preserve brevity and enhance clarity in understanding this embodiment. Heat sink assembly 28 may also have a different structure than heat sink assembly 30 according to other embodiments. One heat sink assembly, for example, may be air cooled while another heat sink assembly may be liquid cooled to provide a double side cooled power module with power overlay.

According to one embodiment, channel heat sink 28 comprises a channel layer 40 described in further detail below with reference to FIG. 3 that is metallurgically bonded to a manifold layer 42, also described in further detail below with reference to FIG. 3.

Figure 3:
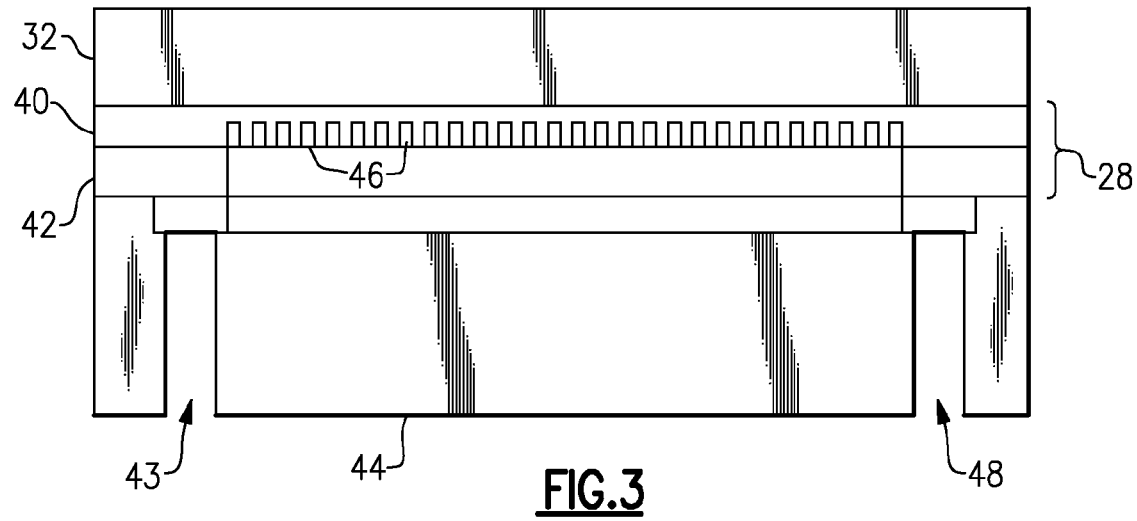
FIG. 3 is a side profile view illustrating a channel heat sink suitable for use with the double side channel cooled power module with power overlay illustrated in FIG. 2.

Looking now at FIG. 3, heat sink assembly 28, according to one embodiment, comprises a channel layer 40 thickness of about 0.3 mm and a manifold layer 42 thickness of about 0.3 mm. According to another embodiment, heat sink assembly 28 includes a channel layer 40 thickness of about 0.15 mm and a manifold layer 42 thickness of about 0.15 mm.

The channel layer 40 may comprise channel geometries that encompass micro-channel dimensions to milli-channel dimensions. Channels 46 may have, for example, a feature size of about 0.05 mm to about 5.0 mm according to some aspects of the invention. Exemplary channel 46 configurations may be formed of continuous micro-channels extending along the substrate. According to another embodiment, channels 46 are about 0.1 mm wide and are separated by a number of gaps of about 0.2 mm. According to yet another embodiment, channels 46 are about 0.3 mm wide and are separated by a number of gaps of about 0.5 mm. According to still another embodiment, channels 46 are about 0.6 mm wide and are separated by a number of gaps of about 0.8 mm.

Manifold layer 42 defines a number of inlet manifolds and a number of outlet manifolds (not shown). The inlet manifolds are configured to receive a coolant, and the outlet manifolds are configured to exhaust the coolant. In one embodiment the inlet and outlet manifolds are interleaved. Channels 46 within channel layer 40 may be oriented substantially perpendicular to the inlet and outlet manifolds according to one aspect of the invention. This structure provides a simple assembly process, which reduces the overall cost of the heat sink assembly 28.

Channel heat sink assembly 28 may also be attached to a base plate/housing 44 to provide fluid passages in close proximity to the power device 22 surface(s), enabling practical and cost effective implementation of the channel cooling technology. The base plate/housing 44 includes an inlet port 43 configured to supply a coolant to the inlet manifolds and an outlet port 48 configured to exhaust the coolant from the outlet manifolds.

Figure 4:
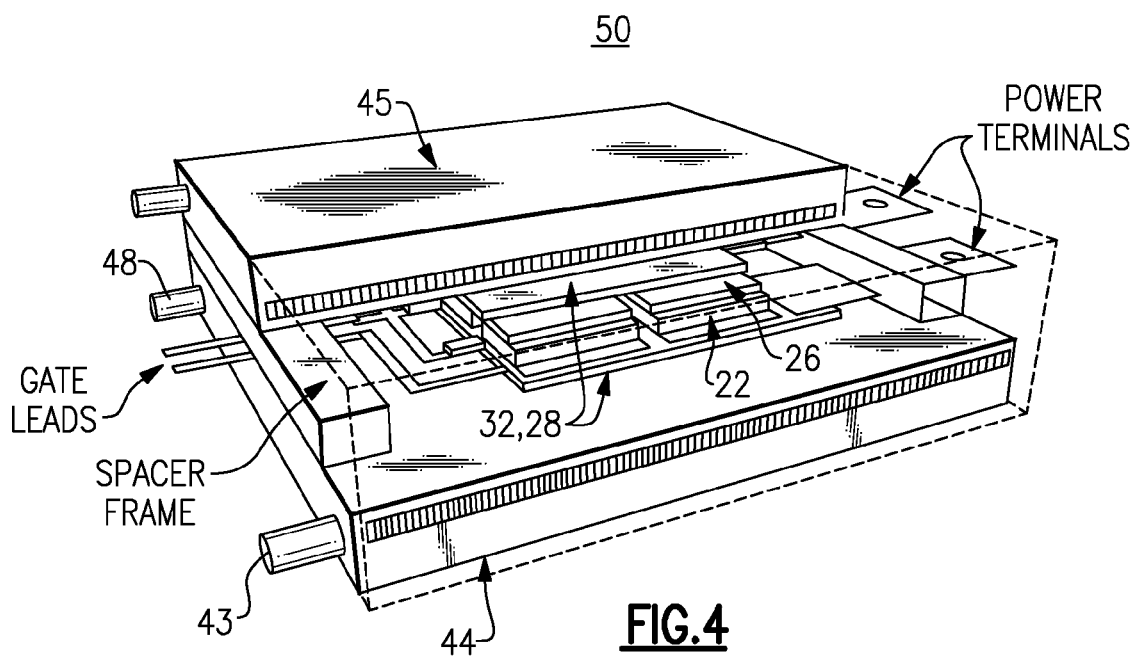
FIG. 4 is a perspective view of a double side channel cooled power module with power overlay according to another embodiment.

FIG. 4 is a perspective view of a double side channel cooled power module 50 using power overlay technology according to another embodiment. Power module 50 comprises a first base plate/housing 44 that is bonded to a heat sink assembly 28 such as depicted in FIGS. 2 and 3, and that includes fluidic passages (not shown) that mirror manifold passages within with the manifold layer 42 according to one embodiment. Base plate/housing 44 further includes at least one inlet port 43 and at least one outlet port 48 and more particularly is bonded to a surface of the manifold layer 42 such as depicted in FIG. 3 that forms one portion of the heat sink assembly 28 in a manner such as described above to provide extended manifold layer inlet and outlet ports. Since base plate 44 is only required to provide a means to transfer cooling fluid, base plate 44 need not be constructed from a metal that is suitable to provide a means of heat transfer. The actual heat transfer process is instead achieved from the metallurgical bonds between the substrate layers, the channel layers and the manifold layers.

A second base plate/housing 45 is bonded to heat exchanger assembly 30 illustrated in FIG. 2 on the opposite side of the power module 50 as shown in FIG. 4 to provide a double side channel cooled power module 50 using power overlay technology. According to one embodiment, channel layer 40, manifold layer 42 and a corresponding base plate/housing 44, 45 are configured as a unitary heat sink assembly that is bonded to a corresponding substrate 32, 38. According to another embodiment, channel layer 40 and manifold layer 42 are together configured as a unitary heat sink assembly that is bonded to a corresponding substrate 32, 38. A corresponding base plate/housing 44, 45 is then bonded to each unitary heat sink assembly that comprises a channel layer 40 and a manifold layer 42 such as depicted in FIG. 3. According to another embodiment, each substrate 32, 38 is bonded to a corresponding channel layer 40 and a corresponding manifold layer 42 to form a respective unitary heat sink assembly. A base plate/housing 44, 45 is then attached to each respective unitary heat sink assembly to complete the double side channel cooled power module 50 as shown in FIG. 4.

Manifold passages are larger in cross-section than that associated with the channel layer channels according to one aspect of the invention in order to provide a desired high level of cooling capacity for the corresponding heat sink assembly 28, 30. Many coolants can be employed for heat sink assemblies 28, 30, and the embodiments are not limited to a particular coolant. Exemplary coolants include water, ethylene-glycol, propylene-glycol, oil, aircraft fuel and combinations thereof According to some embodiments, the coolant comprises a single phase liquid and/or a multi-phase liquid. In operation, the coolant enters the manifolds 42 via base plate/housing inlet port 43 and flows through channel layer channels before returning via base plate/housing outlet port 48 through exhaust manifolds.

According to one aspect, the channel layer channels do not extend through channel layer 40, in order to isolate the coolant from the heated surface of the power device 22. More particularly, each ceramic substrate 32, 38 acts as a dielectric barrier between power devices 22 and the coolant.

In summary explanation, channel-type cooling assembly embodiments and methods of manufacturing the embodiments have been described with reference to FIGS. 2-4. These embodiments may use a high temperature brazing process that avoids contamination or damage to the channels 46 generally associated with soldering techniques. Further, the materials and thicknesses of the heat sink layers that may comprise a corresponding substrate 32, 38, a manifold layer 42, and a channel layer 40 can be closely controlled to prevent undesired interactions between the layers during heating and cooling processing steps. In this manner, the finer features associated with the corresponding channel layer 40 can be protected from damage during the manufacturing process; and the heat sink assembly features can be formed with a high degree of certainty.

According to one embodiment, each substrate structure is constructed as a single unitary device during a sub-assembly process that includes a corresponding ceramic layer 32, 38, a metal layer 27 that is metallurgically bonded to the ceramic layer 32, 38, a channel layer 40 that is metallurgically bonded to the ceramic layer 32, 38, and a manifold layer 42 that is metallurgically bonded to a surface of the channel layer 40. A separate base plate/housing 44, 45 that includes at least one inlet port 43 and at least one outlet port 48 is bonded to a surface of the substrate structure during a final assembly process subsequent to the substrate structure sub-assembly process, and is configured to provide extended manifold layer inlet and outlet ports.

Combining the unitary substrate structure and the unitary base plate/housing during a final assembly stage advantageously avoids contamination or damage to the channels 46 generally associated with soldering techniques using conventional micro-channel construction techniques. Since the base plate/housing 44, 45 only functions as a cooling fluid flow means, and does not serve as a heat sink device, the base plate/housing 44, 45 can be formulated from plastic or other non-metallic compounds suitable for bonding the base plate/housing to the substrate structure without the use of solder.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power module comprising:
at least one semiconductor power device;
a power overlay (POL) bonded to the at least one semiconductor power device;
a first heat sink bonded to the at least one semiconductor power device on a side of the at least one semiconductor power device opposite the POL; and
a second heat sink bonded to the POL via a compliant thermal interface material (TIM) opposite the side of the POL bonded to the at least one semiconductor power device, the at least one semiconductor power device, POL, first heat sink, and second heat sink together forming a double side cooled power overlay module, wherein the compliant TIM is the sole material in direct contact with the POL on the side of the POL bonded to the second heat sink, and further wherein all bonds formed between the second heat sink and the POL are formed via the compliant TIM.

2. The power module according to claim 1, wherein the POL comprises copper and Kapton.

3. The power module according to claim 1, wherein each heat sink comprises a ceramic layer, a channel layer, and a manifold layer together configured as a single unitary heat sink.

4. The power module according to claim 3, wherein the heat sink layers are bonded together via a high temperature bonding process between about 980° C. and about 1000° C.

5. The power module according to claim 3, wherein the ceramic layer is selected from aluminum-oxide ($Al_2O_3$), aluminum nitride (AlN), beryllium oxide (BeO) and silicon nitride ($Si_3N_4$).

6. The power module according to claim 1, further comprising a first ceramic layer bonded between the first heat sink and the at least one semiconductor power device.

7. The power module according to claim 6, further comprising a second ceramic layer bonded between the second heat sink and the POL.

8. The power module according to claim 7, wherein each ceramic layer is selected from aluminum-oxide ($Al_2O_3$), aluminum nitride (AlN), beryllium oxide (BeO) and silicon nitride ($Si_3N_4$).

9. The power module according to claim 7, wherein each heat sink comprises a channel layer and a manifold layer configured together as a single unitary heat sink.

10. The power module according to claim 1, wherein each heat sink comprises a ceramic layer, a channel layer, a manifold layer, and a plenum housing configured together as a single unitary heat sink.

11. The power module according to claim 10, wherein the plenum housing comprises a moldable, castable or machinable material.

12. The power module according to claim 10, further comprising a single-phase or multi-phase cooling fluid disposed within at least one plenum housing.

13. The power module according to claim 1, wherein the TIM has a thermal conductivity greater than about 2 W/mK.

14. The power module according to claim 13, wherein the TIM is selected from adhesives, greases, gels, pads, films, liquid metals, compressible metals, and phase change materials.

15. A power module comprising:
at least one semiconductor power device;
a power overlay (POL) metallurgically bonded to a first surface of the at least one semiconductor power device;
a first substrate assembly bonded to a second surface of the at least one semiconductor power device opposite the first surface, the first substrate assembly comprising:
a ceramic layer comprising a first planar surface and a second planar surface substantially parallel to the first planar surface;
a metal layer bonded to the first planar surface;
a channel layer bonded to the second planar surface; and
a manifold layer bonded to a surface of the channel layer opposite the second planar surface, the first substrate assembly layers configured together as a single unitary substrate; and
a second substrate assembly bonded to the POL solely via a compliant thermal interface material (TIM), the second substrate assembly comprising:
a ceramic layer comprising a third planar surface and a fourth planar surface substantially parallel to the third planar surface;
a metal layer bonded to the third planar surface;
a channel layer bonded to the fourth planar surface; and
a manifold layer bonded to a surface of the channel layer opposite the fourth planar surface, the second substrate assembly layers configured together as a single unitary substrate, wherein the compliant TIM is the sole material in direct contact with the POL on the side of the POL bonded to the second substrate assembly.

16. The power module according to claim 15, further comprising a corresponding plenum/housing bonded to each single unitary substrate, the at least one semiconductor power device, POL, first substrate assembly, second substrate assembly, and corresponding plenum housings together forming a double side cooled power overlay module.

17. The power module according to claim 16, wherein each plenum housing comprises a moldable, castable or machinable material.

18. The power module according to claim 16, further comprising a single-phase or multi-phase cooling fluid disposed within at least one plenum housing.

19. The power module according to claim 15, wherein the POL comprises copper and Kapton.

20. The power module according to claim 15, wherein the TIM has a thermal conductivity greater than about 2 W/mK.

21. The power module according to claim 20, wherein the TIM is selected from adhesives, greases, gels, pads, films, liquid metals, compressible metals, and phase change materials.

22. The power module according to claim 15, wherein the unitary substrate layers are bonded together via a high temperature bonding process between about 980° C. and about 1000° C.

23. A power module comprising:
at least one semiconductor power device;
a power overlay (POL) bonded to the at least one semiconductor power device;
a first heat sink bonded to the at least one semiconductor power device on a side of the at least one semiconductor power device opposite the POL; and
a second heat sink bonded to the POL via a compliant thermal interface material (TIM) opposite the side of the POL bonded to the at least one semiconductor power device, the second heat sink comprising:
a direct bond copper (DBC) structure comprising a ceramic layer and a copper layer bonded to each of opposing sides of the ceramic layer; and
a channel layer bonded to the DBC structure on a side of the DBC structure opposite the POL;
wherein the at least one semiconductor power device, the POL, the first heat sink, and the second heat sink together form a double side cooled power overlay module; and
wherein the compliant TIM is the sole material in direct contact with the POL on the side of the POL bonded to the second heat sink.

* * * * *